United States Patent
Gang et al.

(10) Patent No.: US 10,788,509 B2
(45) Date of Patent: Sep. 29, 2020

(54) HIGH FREQUENCY ACCELEROMETER HOUSING INCLUDING CIRCUIT BOARD DISPOSED DIRECTLY ABOVE SUPPORT PAD

(71) Applicant: Simmonds Precision Products, Inc., Vergennes, VT (US)

(72) Inventors: Travis Gang, Hinesburg, VT (US); Benjamin D. McBride, South Burlington, VT (US); Peter J. Carini, Underhill, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 199 days.

(21) Appl. No.: 15/618,839

(22) Filed: Jun. 9, 2017

(65) Prior Publication Data
US 2018/0356436 A1    Dec. 13, 2018

(51) Int. Cl.
| | | |
|---|---|---|
| G01P 1/02 | (2006.01) | |
| H05K 5/00 | (2006.01) | |
| G01P 15/08 | (2006.01) | |

(52) U.S. Cl.
CPC .......... G01P 1/023 (2013.01); G01P 15/0802 (2013.01); H05K 5/0078 (2013.01)

(58) Field of Classification Search
CPC ... B81B 7/0032–0077; B81B 2207/091; G01P 15/00–18; G01P 15/0802; H05K 5/0078
See application file for complete search history.

(56) References Cited

U.S. PATENT DOCUMENTS

| | | | |
|---|---|---|---|
| 6,213,495 B1* | 4/2001 | Plankl | B60R 21/01 280/727 |
| 7,134,334 B2 | 11/2006 | Schirmer et al. | |
| 8,024,971 B2 | 9/2011 | Kozlov et al. | |
| 8,700,353 B2 | 4/2014 | Khazanov | |
| 2014/0091443 A1 | 4/2014 | Duca et al. | |

FOREIGN PATENT DOCUMENTS

| | | |
|---|---|---|
| EP | 1806565 A1 | 7/2007 |
| WO | WO03001150 A1 | 1/2003 |

OTHER PUBLICATIONS

Extended European Search Report for EP Application No. 18176245.1, dated Aug. 29, 2018, 6 Pages.

* cited by examiner

Primary Examiner — Laura M Menz
Assistant Examiner — Candice Chan
(74) Attorney, Agent, or Firm — Kinney & Lange, P.A.

(57) ABSTRACT

An apparatus includes a housing base and a circuit board. The housing base contains a cavity, a boss containing a mounting bore, and a support pad connected to the boss. The circuit board is positioned in the cavity so that an accelerometer carried by the circuit board is disposed directly above the support pad.

11 Claims, 3 Drawing Sheets

HIGH FREQUENCY ACCELEROMETER HOUSING INCLUDING CIRCUIT BOARD DISPOSED DIRECTLY ABOVE SUPPORT PAD

BACKGROUND

This disclosure relates generally to housings for circuit boards, and more particularly to housings for circuit boards carrying accelerometers for use in sensing high frequency accelerations.

Micro Electro-Mechanical System (MEMS) accelerometers are low cost devices used to measure acceleration. MEMS accelerometers are typically contained in electronics chips to enable direct mounting of the chip (and accelerometer) to a circuit board. Mounting the accelerometer directly to the circuit board enables analog data from the accelerometer to be digitized and processed in the immediate vicinity of the sensing location prior to transmission of the data to consuming systems. Such localized digitization and processing defines functionality for what is often referred to as a smart sensor. Smart sensors can beneficially increase the accuracy of the data received by consuming systems by minimizing noise introduced by analog transmission. Moreover, the use of such smart sensors can help to decrease system weight, increase system flexibility through decreased requirements for analog transmissions, and decrease the processing load on a sensor system host computer.

Resonant frequencies of the housing surrounding the circuit board of the sensor can interfere with accurate sensing of acceleration within frequency ranges including those resonant frequencies. For instance, accelerations that translate through the housing to the accelerometer can be amplified, attenuated, or phase-shifted at or near resonant frequencies of the housing, thereby decreasing accuracy of the sensed accelerations.

SUMMARY

In one example, an apparatus includes a housing base and a circuit board. The housing base contains a cavity, a boss containing a mounting bore, and a support pad connected to the boss. The circuit board is positioned in the cavity so that an accelerometer carried by the circuit board is disposed directly above the support pad.

In another example, a housing includes a base and a cover. The base includes a bottom, a first sidewall, a second sidewall opposite the first sidewall, a first end wall, and a second end wall opposite the first end wall, a boss, a U-shaped cavity, a support pad within the U-shaped cavity, at least one wiring port formed in the second end wall, and a rim and recessed support shelf at an upper end of the base. The boss is connected to the first end wall via a neck. The boss contains a mounting bore that extends through the boss and the bottom of the base. The U-shaped cavity is defined by the bottom, the first sidewall, the second sidewall, the first end wall, the second end wall, the boss, and the neck. The support pad extends from the boss to the second end wall. The rim and recessed support shelf surround the U-shaped cavity. The cover nests in the upper end of the base and is supported by the recessed support shelf.

DETAILED DESCRIPTION

According to techniques of this disclosure, a housing for a circuit board carrying an accelerometer (e.g., a MEMS accelerometer) for use in high frequency applications has a first mode resonant frequency that is greater than a frequency range of interest for sensed accelerations, such as a first mode resonant frequency that is greater than 25 kilohertz (kHz). The housing is mountable with a single fastener through a mounting bore contained in a boss of the housing. A U-shaped cavity of the housing encloses a U-shaped circuit board carrying the accelerometer directly above a support pad within the U-shaped cavity. The support pad extends from the boss to an end wall to transfer monitored vibrations through the boss to the accelerometer to convey representative vibrational response of the system to the accelerometer. The support pad further provides rigidity to an end of the housing that is opposite the mounting bore and increases stiffness of the housing and the corresponding resonant frequencies. Accordingly, a housing implementing techniques described herein can securely house a circuit board having an accelerometer (e.g., a MEMS accelerometer) mounted thereon while maintaining a first order resonant frequency that is greater than a frequency range of interest for sensed accelerations (e.g., greater than 25 kHz).

Figure 1:
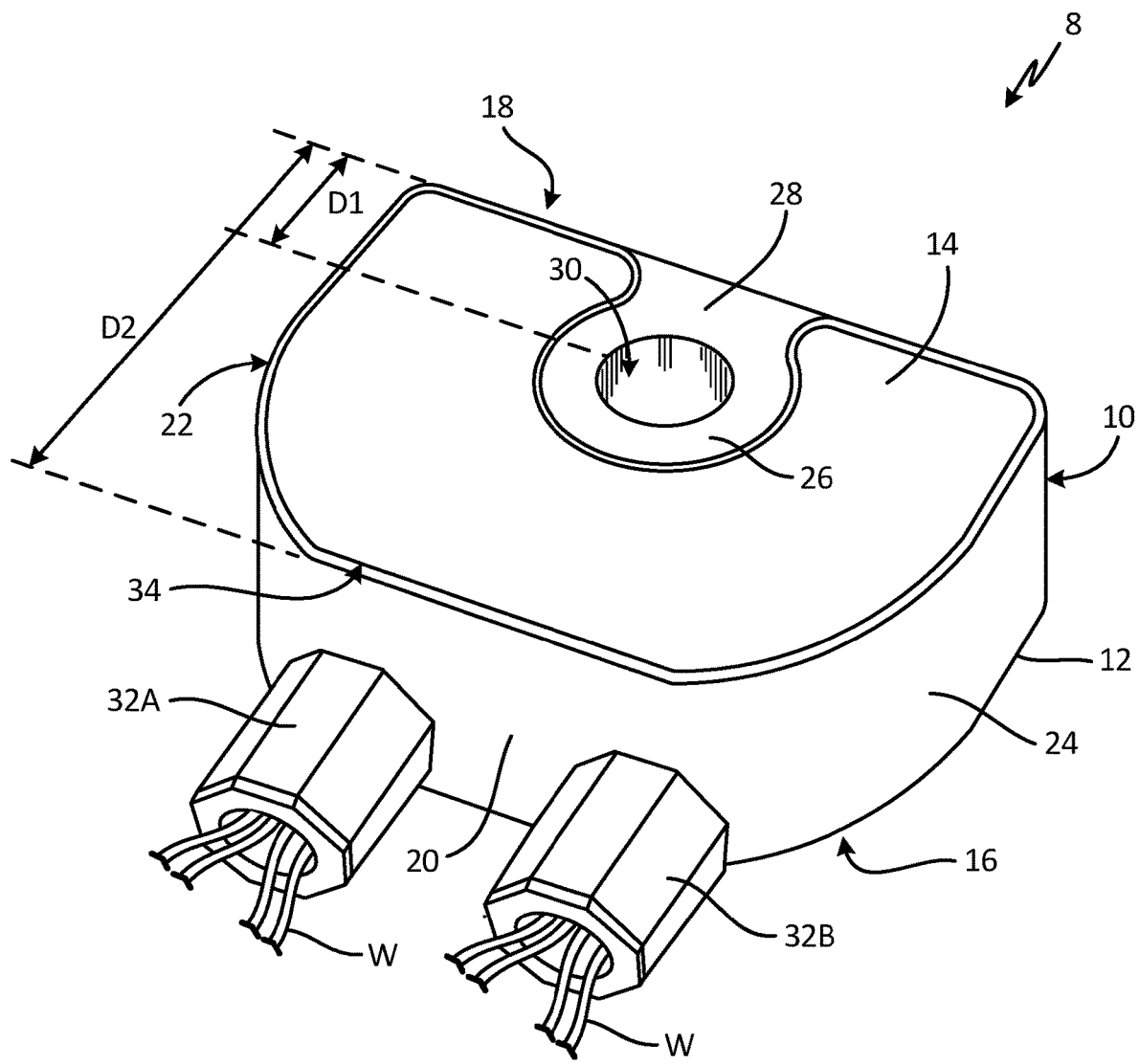
FIG. 1 is a perspective view of an example smart sensor showing an assembled housing that encloses a U-shaped circuit board carrying an accelerometer.

FIG. 1 is a perspective view showing smart sensor 8 in an assembled state. Housing 10 of smart sensor 8 encloses a circuit board carrying an accelerometer as well as processing and communication circuitry, as is further described below. As illustrated in FIG. 1, housing 10 includes base 12 and cover 14. Base 12 includes bottom 16, first end wall 18, second end wall 20, first sidewall 22, second sidewall 24, boss 26, neck 28, mounting bore 30, wiring port 32A, and wiring port 32B. Wiring ports 32A and 32B provide access to an interior of housing 10 for wiring W.

First end wall 18 is opposite second end wall 20. First sidewall 22 is opposite second sidewall 24. First end wall 18, second end wall 20, first sidewall 22, and second sidewall 24 form an outer periphery of base 12 that is perpendicular to bottom 16 and parallel to mounting bore 30 extending through boss 26. Housing 10 is configured to mount to a surface parallel to bottom 16 via a bolt, rivet, screw, or other fastener that extends through mounting bore 30. That is, mounting bore 30 extends through boss 26 and bottom 16 such that a fastener extending through mounting bore 30 connects housing 10 to the surface parallel to bottom 16.

As illustrated in FIG. 1, boss 26 connects to first end wall 18 via neck 28. In some examples, distance D1 from first end wall 18 to a center of mounting bore 30 extending through boss 26 is less than half of distance D2 from first end wall 18 to second end wall 20. In certain examples, distance D1 is less than one third of distance D2. In general, a shorter distance D1 enables housing 10 to be mounted closer to a wall, a component, or other structure that is perpendicular to first end wall 18.

Wiring ports 32A and 32B extend through second end wall 20 to provide access for wiring W (e.g., electrical wires, cables, or other electrical and/or communicative connections) for connection with components of the circuit board enclosed within housing 10. Though illustrated in FIG. 1 as including two wiring ports 32A and 32B, in other examples, housing 10 can include more than two wiring ports (e.g., three or more wiring ports) or a single wiring port. Similarly, though the example of FIG. 1 illustrates wiring ports 32A and 32B as extending through second end wall 20, in other examples, any one or more of wiring ports 32A and 32B can extend through other portions of housing 10, such as through bottom 16, cover 14, first sidewall 22, second sidewall 24, or first end wall 18. In some examples, such as when components of the circuit board enclosed within housing 10 communicate wirelessly with external systems, housing 10 may not include any wiring ports, but can in some examples.

Cover 14, as illustrated in FIG. 1, nests in upper end 34 of base 12 so that a top surface of cover 14 is coplanar (i.e., flush) with a top surface of base 12. Cover 14, in some examples, is welded, brazed, adhesively bonded, or otherwise fixedly attached to base 12 after assembly. Housing 10 can be formed of metal, such as stainless steel, aluminum, titanium, an Inconel alloy, or other metal via additive, subtractive, metal injection molding, or other manufacturing technique. In certain examples, housing 10 is hermetically sealed to prevent the passage of air or other gas into and out of an interior of housing 12. In certain examples, housing 10 may not include cover 14, such as when an interior of housing 10 is potted after assembly.

Accordingly, housing 10 implementing techniques of this disclosure can securely house a circuit board having an accelerometer (e.g., a MEMS accelerometer) mounted thereon. Moreover, a structural configuration of housing 10 ensures that housing 10 has a first order resonant frequency that is greater than a frequency range of interest for sensed accelerations (e.g., greater than 25 kHz), as is further described below. As such, housing 10 can enable secure mounting and enclosure of the accelerometer for high frequency applications (e.g., up to 25 kHz frequencies of accelerations) and can extend the upper limit of frequencies that can be sensed without significant amplification or attenuation of the sensed accelerations due to the first mode resonant frequency of housing 10.

Figure 2:
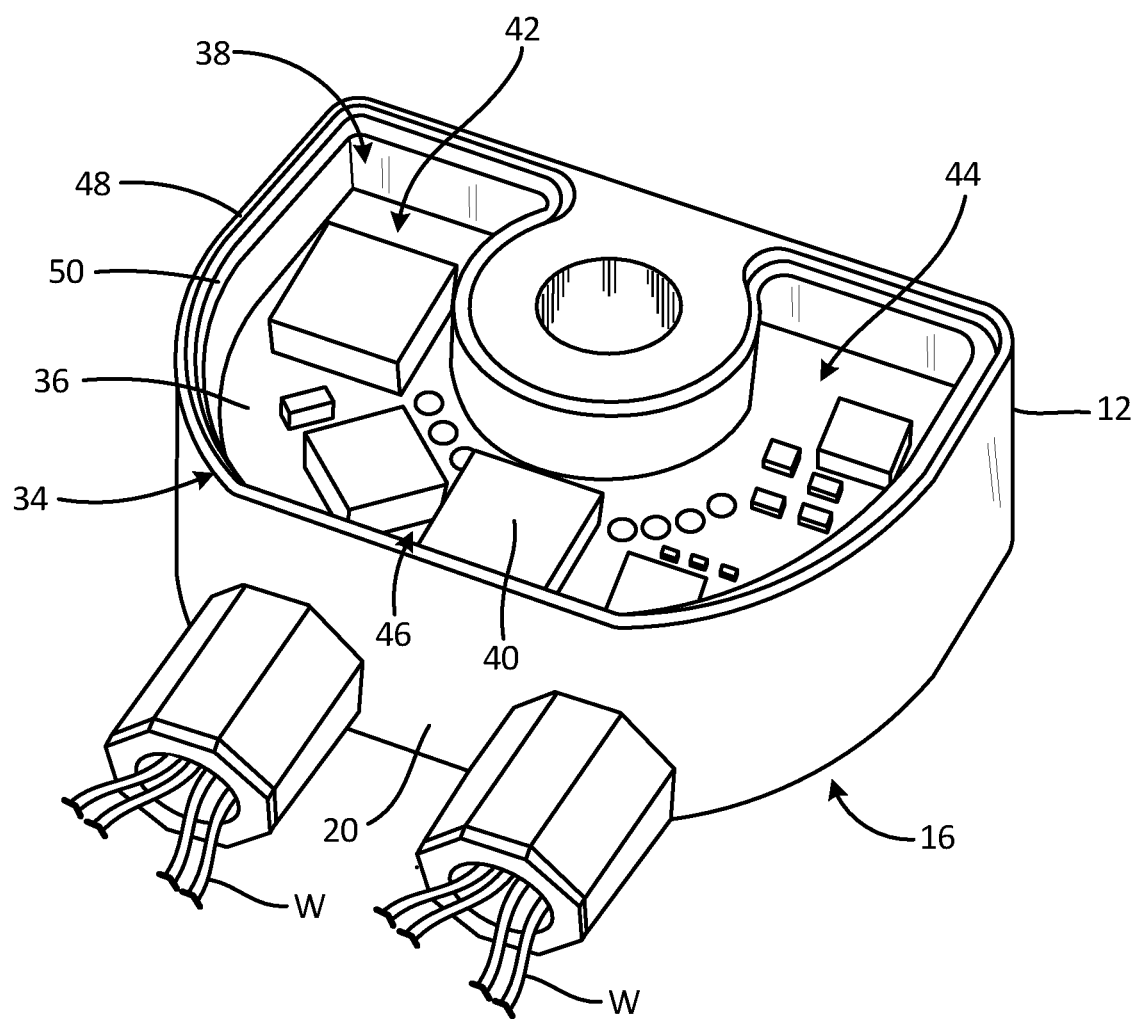
FIG. 2 is a perspective view of the example housing of FIG. 1 with the cover removed and showing the U-shaped circuit board within the housing.

FIG. 2 is a perspective view of base 12 of housing 10 of FIG. 1 with cover 14 removed and showing U-shaped circuit board 36 mounted within U-shaped cavity 38. As illustrated in FIG. 2, U-shaped circuit board 36 includes accelerometer 40 as well as various other electrical components, such as processing circuitry, communication circuitry, integrated circuits, and other electrical components. U-shaped circuit board 36 includes first arm 42 and second arm 44 that are joined at central region 46 that carries accelerometer 40. U-shaped circuit board 36 is supported within U-shaped cavity 38 during operation. Accelerometer 40, in this example, is a MEMS accelerometer configured to sense acceleration forces in a direction that is parallel with bottom 16.

As further illustrated in FIG. 2, upper end 34 of base 12 includes rim 48 and recessed support shoulder 50 that surround U-shaped cavity 38. Rim 48 and recessed support shoulder 50 are configured to receive and provide support for cover 14 (FIG. 1) so that a top surface of cover 14 is coplanar (i.e., flush) with a top surface of base 12.

In the example of FIG. 2, electrical and/or communication wires enter U-shaped cavity 38 below circuit board 36 via wiring ports 32A and 32B. In other examples, wiring ports 32A and 32B can be positioned in second end wall 20 such that electrical and/or communication wires enter U-shaped cavity 38 above U-shaped circuit board 36.

In operation, components mounted on U-shaped circuit board 36 receive electrical power and send and receive data with consuming and producing systems via the electrical and/or communication wires. Accelerometer 40 senses acceleration forces that are processed (e.g., filtered, digitized, or otherwise processed) by processing circuitry of U-shaped circuit board 36 and transmitted to consuming systems via electrical and/or communicative wired communications through one or more of wiring ports 32A and 32B. In some examples, U-shaped circuit board 36 can include one or more wireless transceivers. In such examples, communications including transmission of sensed acceleration data can be accomplished via the wireless communications.

Accelerometer 40 can be configured to sense acceleration forces in a frequency range of interest, such as a frequency range of 10 Hz to 25 kHz. Housing 10 (FIG. 1) including base 12 and cover 14 (FIG. 1) can have a first mode resonant frequency that is greater than the frequency range of interest, such as a first mode resonant frequency that is greater than 25 kHz. As such, housing 10 can extend the upper limit of frequencies that can be sensed by accelerometer 40 via propagation through housing 10 without significant amplification or attenuation due to the first mode resonant frequency of housing 10. Accordingly, housing 10 can increase an accuracy of sensed acceleration data transmitted to consuming systems.

Figure 3:
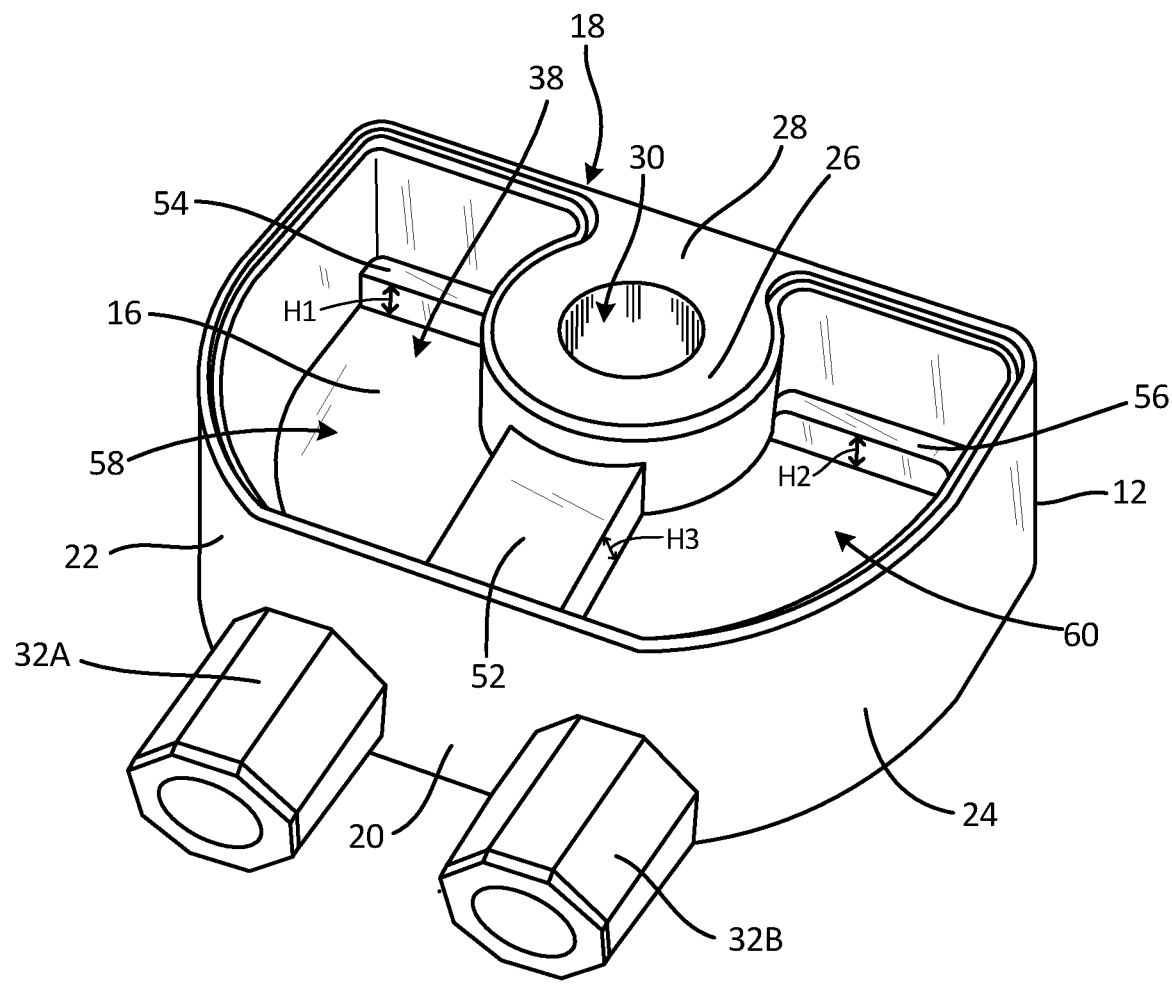
FIG. 3 is a perspective view of the example housing of FIGS. 1 and 2 showing the base portion with the cover and the U-shaped circuit board removed.

FIG. 3 is a perspective view of base 12 of housing 10 of FIG. 1 with cover 14 (FIG. 1), U-shaped circuit board 36 (FIG. 2), and wiring W (FIGS. 1 and 2) removed. As illustrated in FIG. 3, U-shaped cavity 38 of base 12 further includes support pad 52, first support shoulder 54, second support shoulder 56, first pocket 58, and second pocket 60.

First support shoulder 54 is adjacent first end wall 18 within U-shaped cavity 38 and extends from neck 28 and boss 26 to first sidewall 22. Second support shoulder 56 is adjacent first end wall 18 within U-shaped cavity 38 and extends from neck 28 and boss 26 to second sidewall 24. First support shoulder 54 provides support beneath first arm 42 (FIG. 2) of U-shaped circuit board 36. Second support shoulder 56 provides support beneath second arm 44 (FIG. 2) of U-shaped circuit board 36. Though first support shoulder 54 and second support shoulder 56 are each illustrated in the example of FIG. 3 as extending along first end wall 18, in other examples, any one or more of first support shoulder 54 and second support shoulder 56 can be located within U-shaped cavity 38 at other locations. For instance, first support shoulder 54 can be located within U-shaped cavity 38 and extending along first sidewall 22, boss 26, or other locations to provide support beneath first arm 42 of U-shaped circuit board 36. Similarly, second support shoulder 56 can be located within U-shaped cavity 38 and extending along second sidewall 24, boss 26, or other locations to provide support beneath second arm 44 of U-shaped circuit board 36.

Support pad 52 is positioned within U-shaped cavity 38 and extends from boss 26 to second end wall 20. Support pad 52 provides support beneath central region 46 (FIG. 2) of U-shaped circuit board 36 that carries accelerometer 40 (FIG. 2). That is, accelerometer 40 is disposed on U-shaped circuit board 36 directly above support pad 52. Support pad 52, extending from boss 26 to first end wall 20, transfers a force load experienced at central region 46 of U-shaped circuit board 36 (which carries accelerometer 40) directly to boss 26 that is attached to a mounting structure via a connector through mounting bore 30. Accordingly, support pad 52 helps to provide rigidity to base 12 from boss 26 to second end wall 20. As such, support pad 52 helps to increase stiffness and hence the corresponding first mode resonant frequency of base 12 and the overall housing 10. In some examples, any one or more of bottom 16, first sidewall 22, second sidewall 24, first end wall 18, second end wall 20, and cover 14 (FIG. 1) can be formed with a series of structural ridges, honeycomb pattern, or other structural pattern to further increase stiffness and hence the corresponding first mode resonant frequency of housing 10. As such, housing 10, including base 12 and cover 14, can be designed such that a first mode resonant frequency of housing 10 is greater than a frequency range of interest, such as greater than 25 kHz.

Though neck 28 is illustrated in the example of FIG. 3 as having a top surface that is coplanar with a top surface of base 12, in other examples neck 28 can be formed such that a top surface of base 12 is recessed from the top surface of base 12. For instance, a top surface of neck 28 can be coplanar with a top surface of support pad 52, or otherwise recessed below a top surface of base 12.

In operation, U-shaped circuit board 36 is supported within U-shaped cavity 38 on support pad 52, first support shoulder 54, and second support shoulder 56. U-shaped circuit board 36 can be adhered to base 12 at support pad 52, first support shoulder 54, and second support shoulder 56, such as by mechanically fastening U-shaped circuit board 36 to each of support pad 52, first support shoulder 54, and second support shoulder 56 via one or more screws, rivets, or other fastening devices. In some examples, U-shaped circuit board 36 can be adhered to base 12 at support pad 52, first support shoulder 54, and second support shoulder 56 via ultrasonic welding of plating beneath U-shaped circuit board 36 and plating covering support pad 52, first support shoulder 54, and second support shoulder 56. In certain examples, U-shaped circuit board 36 can be adhesively adhered to base 12 at support pad 52, first support shoulder 54, and second support shoulder 56. In general, U-shaped circuit board 36 is supported within and adhered to base 12 at support pad 52, first support shoulder 54, and second support shoulder 56.

Height H1 of first support shoulder 54 from bottom 16 to a top surface of first support shoulder 54 and height H2 of second support shoulder 56 from bottom 16 to a top surface of second support shoulder 56 match height H3 of support pad 52 from bottom 16 to a top surface of support pad 52. First pocket 58 is located below first arm 42 (FIG. 2) of U-shaped circuit board 36. First pocket 58 is defined by bottom 16, first support shoulder 54, first sidewall 22, second end wall 20, support pad 52, and boss 26. Second pocket 60 is located below second arm 44 (FIG. 2) of U-shaped circuit board 36. Second pocket 60 is defined by bottom 16, second support shoulder 56, second sidewall 24, second end wall 20, support pad 52, and boss 26. In the example of FIG. 3, wiring port 32A extends through second end wall 20 into first pocket 58 below U-shaped circuit board 36, and wiring port 32B extends through second end wall 20 into second pocket 60 below U-shaped circuit board 36 to enable the wired connections. In some examples, U-shaped cavity 38 can include more than two pockets.

Accordingly, support pad 52, first support shoulder 54, and second support shoulder 56 provide support for U-shaped circuit board 36 within U-shaped cavity 38. Support pad 52, extending from boss 26 to second end wall 20, transfers structural forces experienced by base 12 at end wall 20 directly to boss 26, thereby increasing rigidity and the corresponding first mode resonant frequency of base 12 and the overall housing 10.

Discussion of Possible Embodiments

The following are non-exclusive descriptions of possible embodiments of the present invention.

An apparatus includes a housing base and a circuit board. The housing base contains a cavity, a boss containing a mounting bore, and a support pad connected to the boss. The circuit board is positioned in the cavity so that an accelerometer carried by the circuit board is disposed directly above the support pad.

The apparatus of the preceding paragraph can optionally include, additionally and/or alternatively, any one or more of the following features, configurations, operations, and/or additional components:

The housing base can include a bottom, a first sidewall, a second sidewall opposite the first sidewall, a first end wall, and a second end wall opposite the first end wall. The boss can be connected to the first end wall via a neck. The cavity can be defined by the bottom, the first sidewall, the second sidewall, the first end wall, the second end wall, the boss, and the neck. The support pad can extend from the boss to the second end wall.

The cavity can be a U-shaped cavity. The circuit board can be a U-shaped circuit board having a first arm and a second arm joined at a central region that carries the accelerometer directly above the support pad.

The apparatus can further includes a housing cover that closes the U-shaped cavity. An upper end of the housing base can include a rim and a recessed support shelf that surround the U-shaped cavity for receiving and supporting the housing cover.

The housing cover can nest in the upper end of the housing base so that a top surface of the housing cover is coplanar with a top surface of the housing base.

The housing base can further contain: a first support shoulder within the U-shaped cavity to provide support beneath the first arm of the U-shaped circuit board; and a second support shoulder within the U-shaped cavity to provide support beneath the second arm of the U-shaped circuit board.

A height of each of the first support shoulder and the second support shoulder from the bottom of the housing can match a height of the support pad from the bottom of the housing.

The U-shaped cavity can include a first pocket below the first arm of the U-shaped circuit board, and a second pocket below the second arm of the U-shaped circuit board.

The first pocket can be defined by the bottom, the first support shoulder, the first sidewall, the second end wall, the support pad, and the boss. The second pocket can be defined by the bottom, the second support shoulder, the second sidewall, the second end wall, the support pad, and the boss.

The apparatus can further include at least one wiring port that provides access for wires into the cavity.

The apparatus can further include a first wiring port that extends through the second end wall into the first pocket, and a second wiring port that extends through the second end wall into the second pocket.

A distance from a center of the mounting bore to the first end wall can be less than half of a distance from the first end wall to the second end wall.

The accelerometer can be configured to sense acceleration in a direction that is parallel with the bottom of the housing base.

A housing includes a base and a cover. The base includes a bottom, a first sidewall, a second sidewall opposite the first sidewall, a first end wall, and a second end wall opposite the first end wall, a boss, a U-shaped cavity, a support pad within the U-shaped cavity, at least one wiring port formed in the second end wall, and a rim and recessed support shelf at an upper end of the base. The boss is connected to the first end wall via a neck. The boss contains a mounting bore that extends through the boss and the bottom of the base. The U-shaped cavity is defined by the bottom, the first sidewall, the second sidewall, the first end wall, the second end wall, the boss, and the neck. The support pad extends from the boss to the second end wall. The rim and recessed support shelf surround the U-shaped cavity. The cover nests in the upper end of the base and is supported by the recessed support shelf.

The housing of the preceding paragraph can optionally include, additionally and/or alternatively, any one or more of the following features, configurations, operations, and/or additional components:

The base of the housing can further include a first support shoulder adjacent the first end wall within the U-shaped cavity and a second support shoulder adjacent the first end wall within the U-shaped cavity.

The U-shaped cavity can include: a first pocket defined by the bottom, the first support shoulder, the first sidewall, the second end wall, the support pad, and the boss; and a second pocket defined by the bottom, the second support shoulder, the second sidewall, the second end wall, the support pad, and the boss.

A height of each of the first support shoulder and the second support shoulder from the bottom of the housing can match a height of the support pad from the bottom of the housing.

The at least one wiring port formed in the second end wall can include a first wiring port and a second wiring port. The first wiring port can extend through the second end wall into the first pocket. The second wiring port can extend through the second end wall into the second pocket.

A distance from a center of the mounting bore to the first end wall can be less than half of a distance from the first end wall to the second end wall.

The cover can nest in the upper end of the base so that a top surface of the cover is coplanar with a top surface of the base.

A first mode resonant frequency of the housing can be at least twenty-five kilohertz (kHz).

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An apparatus comprising:
a housing base that contains a cavity, a boss containing a mounting bore, and a support pad connected to the boss; and
a circuit board positioned in the cavity so that an accelerometer carried by the circuit board is disposed directly above the support pad;
wherein the housing base includes a bottom, a first sidewall, a second sidewall opposite the first sidewall, a first end wall, and a second end wall opposite the first end wall;
wherein the boss is connected to the first end wall via a neck;
wherein the cavity is defined by the bottom, the first sidewall, the second sidewall, the first end wall, the second end wall, the boss, and the neck; and
wherein the support pad extends along a span from the boss to the second end wall, and extends from the bottom to the circuit board along the entire span.

2. The apparatus of claim 1,
wherein the cavity is a U-shaped cavity; and
wherein the circuit board is a U-shaped circuit board having a first arm and a second arm joined at a central region that carries the accelerometer directly above the support pad.

3. The apparatus of claim 2, further comprising:
a housing cover that closes the U-shaped cavity;
wherein an upper end of the housing base comprises a rim and a recessed support shelf that surround the U-shaped cavity for receiving and supporting the housing cover.

4. The apparatus of claim 3,
wherein the housing cover nests in the upper end of the housing base so that a top surface of the housing cover is coplanar with a top surface of the housing base.

5. The apparatus of claim 2,
wherein the housing base further contains:
a first support shoulder within the U-shaped cavity to provide support beneath the first arm of the U-shaped circuit board; and
a second support shoulder within the U-shaped cavity to provide support beneath the second arm of the U-shaped circuit board.

6. The apparatus of claim 5,
wherein a height of each of the first support shoulder and the second support shoulder from the bottom of the housing matches a height of the support pad from the bottom of the housing.

7. The apparatus of claim 5,
wherein the U-shaped cavity includes:
a first pocket below the first arm of the U-shaped circuit board; and
a second pocket below the second arm of the U-shaped circuit board.

8. The apparatus of claim 7,
wherein the first pocket is defined by the bottom, the first support shoulder, the first sidewall, the second end wall, the support pad, and the boss; and
wherein the second pocket is defined by the bottom, the second support shoulder, the second sidewall, the second end wall, the support pad, and the boss.

9. The apparatus of claim 1,
wherein a distance from a center of the mounting bore to the first end wall is less than half of a distance from the first end wall to the second end wall.

10. The apparatus of claim 1, further comprising:
at least one wiring port that provides access for wires into the cavity.

11. The apparatus of claim 1,
wherein the accelerometer is configured to sense acceleration in a direction that is parallel with the bottom of the housing base.

* * * * *